(12) United States Patent
Kitamoto et al.

(10) Patent No.: US 6,529,434 B2
(45) Date of Patent: Mar. 4, 2003

(54) SEMICONDUCTOR MEMORY DEVICE WITH CONCURRENT REFRESH AND DATA ACCESS OPERATION

(75) Inventors: Ayako Kitamoto, Kawasaki (JP); Masato Matsumiya, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/911,374

(22) Filed: Jul. 25, 2001

(65) Prior Publication Data

US 2002/0021609 A1 Feb. 21, 2002

(30) Foreign Application Priority Data

Aug. 21, 2000 (JP) ........................................ 2000-250185

(51) Int. Cl.[7] ................................................ G11C 7/00
(52) U.S. Cl. ...................................... 365/222; 365/207
(58) Field of Search ................................ 365/222, 207, 365/203, 189.05, 205

(56) References Cited

U.S. PATENT DOCUMENTS

| | | | | |
|---|---|---|---|---|
| 5,701,269 A | * | 12/1997 | Fujii | ........................ 365/203 |
| 6,154,386 A | * | 11/2000 | Ong | ........................ 365/190 |
| 6,154,405 A | * | 11/2000 | Takemae et al. | ........ 365/189.04 |
| 6,188,624 B1 | * | 2/2001 | Zheng | ........................ 365/205 |

FOREIGN PATENT DOCUMENTS

| | | |
|---|---|---|
| JP | 60-197997 | 10/1985 |
| JP | 61-202395 | 9/1986 |
| JP | 3-238692 | 10/1991 |

* cited by examiner

*Primary Examiner*—Michael S. Lebentritt
*Assistant Examiner*—Anh Phung
(74) *Attorney, Agent, or Firm*—Arent Fox Kintner Plotkin & Kahn, PLLC

(57) ABSTRACT

A semiconductor memory device includes bit lines which transfer data of memory cells, a sense amplifier which is connected to the bit lines, and amplifies data on the bit lines that appears in response to an external access, and a latch circuit which is connected to the bit lines, and amplifies and latches data on the bit lines that appears as data to be refreshed.

8 Claims, 9 Drawing Sheets

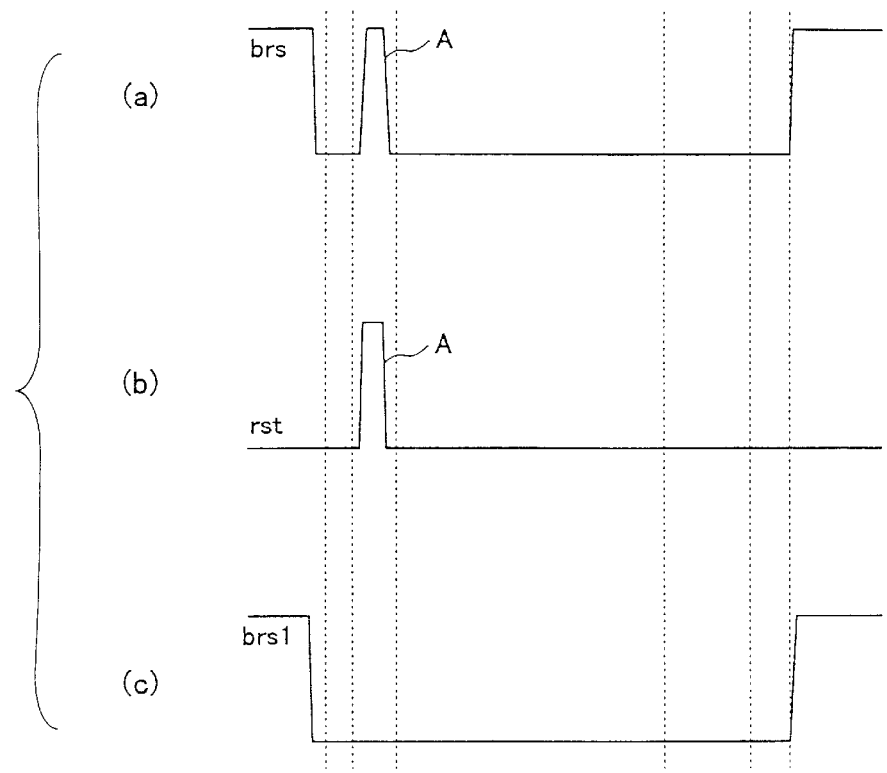

SEMICONDUCTOR MEMORY DEVICE WITH CONCURRENT REFRESH AND DATA ACCESS OPERATION

BACKGROUND OF THE INVENTION

1. Field of the Invention

The present invention generally relates to semiconductor memory devices, and particularly relates to a semiconductor memory device that performs a refresh operation.

2. Description of the Related Art

DRAMs (dynamic random access memories) need to periodically refresh data stored in memory cells. Such a refresh operation may be carried out in response to a refresh command supplied from an exterior of the device. Alternately, a pulse signal may be internally generated at refresh intervals, and a refresh operation may be performed at timing indicated by the pulse signal. This eliminates a need to provide a refresh command at every turn from the exterior of the device.

When a refresh operation is performed at refresh timing internally determined inside the semiconductor memory device, data cannot be read or written during refresh cycles. In order to free from and thus make invisible the refresh cycles from the outside, there are certain schemes that make it possible to perform a refresh operation concurrently with a data access operation.

FIG. 1 and FIG. 2 are timing charts for explaining a scheme that performs a refresh operation concurrently with a data access operation.

FIG. 1 shows a case in which a refresh operation is carried out immediately prior to a data access operation, and FIG. 2 shows a case in which a refresh operation is carried out immediately following a data access operation. In each figures, (a) shows a word-line activation signal WLR for a word to be refreshed and a word-line activation signal WL0 for a word to be accessed. A letter designation (b) shows a timing signal brs for performing precharge and equalization processing, and a letter designation (c) shows transfer gate signals ISO0 and ISO1 for connecting a sense amplifier to the cell arrays provided on both sides of the sense amplifier. When the transfer gate signal ISO0 becomes HIGH, the sense amplifier is connected to the cell array on one side. When the transfer gate signal ISO1 becomes HIGH, the sense amplifier is connected to the cell array on the other side. A letter designation (d) indicates signals psa and nsa for driving a sense amplifier, and a letter designation (e) shows bit-line potentials BL and /BL.

At constant refresh intervals, a refresh signal is generated inside the semiconductor memory device to serve as a pulse signal for triggering a refresh operation. When a data access operation is requested immediately after the generation of a refresh signal, a refresh operation is carried out immediately before the data access operation as shown in FIG. 1 When a refresh signal is generated during the execution of a data access operation, a refresh operation is performed immediately after the data access operation as shown in FIG. 2.

In the case of a refresh operation being performed immediately prior to a data access operation, as shown in FIG. 1, data of a word to be refreshed is read from a memory cell to a bit line in response to the word-line activation signal WLR, which causes changes in the bit-line potentials BL and /BL. After this, the sense amplifier driving signals psa and nsa are activated to amplify the bit-line potentials BL and /BL. When this amplified data is restored, i.e., is written back to the memory cell of the word to be refreshed, a refresh operation is completed. As shown in FIG. 1, (b), the timing signal brs triggers precharge and equalization processing with respect to the bit lines before the start of an actual data access operation. This sets the pair of bit lines to the same precharge potential. Thereafter, a word to be subjected to data access is accessed by the word-line activation signal WL0.

In the case of a refresh operation being performed immediately following a data access operation, as shown in FIG. 2, data access is followed by a precharge operation first, then followed by the refreshing of memory cells.

If a request for a data access operation is not made within a predetermined time period from the generation of a refresh signal, a refresh operation alone is carried out within a prescribed time period after the refresh signal.

Through the operations as described above, it is possible to obviate a trouble that data access cannot be made during a refresh cycle. Namely, it is possible to make invisible or free from refresh cycles from the outside of the device.

Such operations, however, require both the word-line selection and the data storage operation to be performed twice during a single active cycle. This may result in a problem such as a delay in data access time. An attempt to shorten the cycle may result in an insufficient data restoration time, which may degrade a data-retention capability because of insufficient electric charge in memory cells.

Accordingly, there is a need for a semiconductor memory device that makes a refresh operation invisible from the outside, and shortens a delay in data access time caused by a refresh cycle.

SUMMARY OF THE INVENTION

It is a general object of the present invention to provide a semiconductor memory device that substantially obviates one or more of the problems caused by the limitations and disadvantages of the related art.

Features and advantages of the present invention will be set forth in the description which follows, and in part will become apparent from the description and the accompanying drawings, or may be learned by practice of the invention according to the teachings provided in the description. Objects as well as other features and advantages of the present invention will be realized and attained by a semiconductor memory device particularly pointed out in the specification in such full, clear, concise, and exact terms as to enable a person having ordinary skill in the art to practice the invention.

To achieve these and other advantages and in accordance with the purpose of the invention, as embodied and broadly described herein, the invention provides a semiconductor memory device including bit lines which transfer data of memory cells, a sense amplifier which is connected to the bit lines, and amplifies data on the bit lines that appears in response to an external access, and a latch circuit which is connected to the bit lines, and amplifies and latches data on the bit lines that appears as data to be refreshed.

In the invention as described above, the latch circuit is provided for the purpose of temporarily storing the data to be refreshed. The data to be refreshed is supplied to the latch circuit first. While the latch circuit amplifies and latches the data, a data access operation such as a data read operation or a data write operation is performed. After the completion of the data access operation, the data of the latch is restored in the memory cell to be restored. The present invention makes it possible to concurrently perform the refresh operation with the data access operation, thereby making invisible the refresh cycles from outside the device.

There is no need to perform both a word-line selection and a data-restore operation twice consecutively as in the related art, so that an extension of a data access cycle can be made minimum. This makes it possible to shorten a delay in the data access time compared to the related-art configuration. If a data access is not made concurrently with or within a predetermined time period from the refresh signal, a refresh operation alone is performed.

BRIEF DESCRIPTION OF THE DRAWINGS

FIG. 9 is a drawing showing signal waveforms of a reset signal and a precharge signal.

DESCRIPTION OF THE PREFERRED EMBODIMENTS

In the following, embodiments of the present invention will be described with reference to the accompanying drawings.

Figure 3:
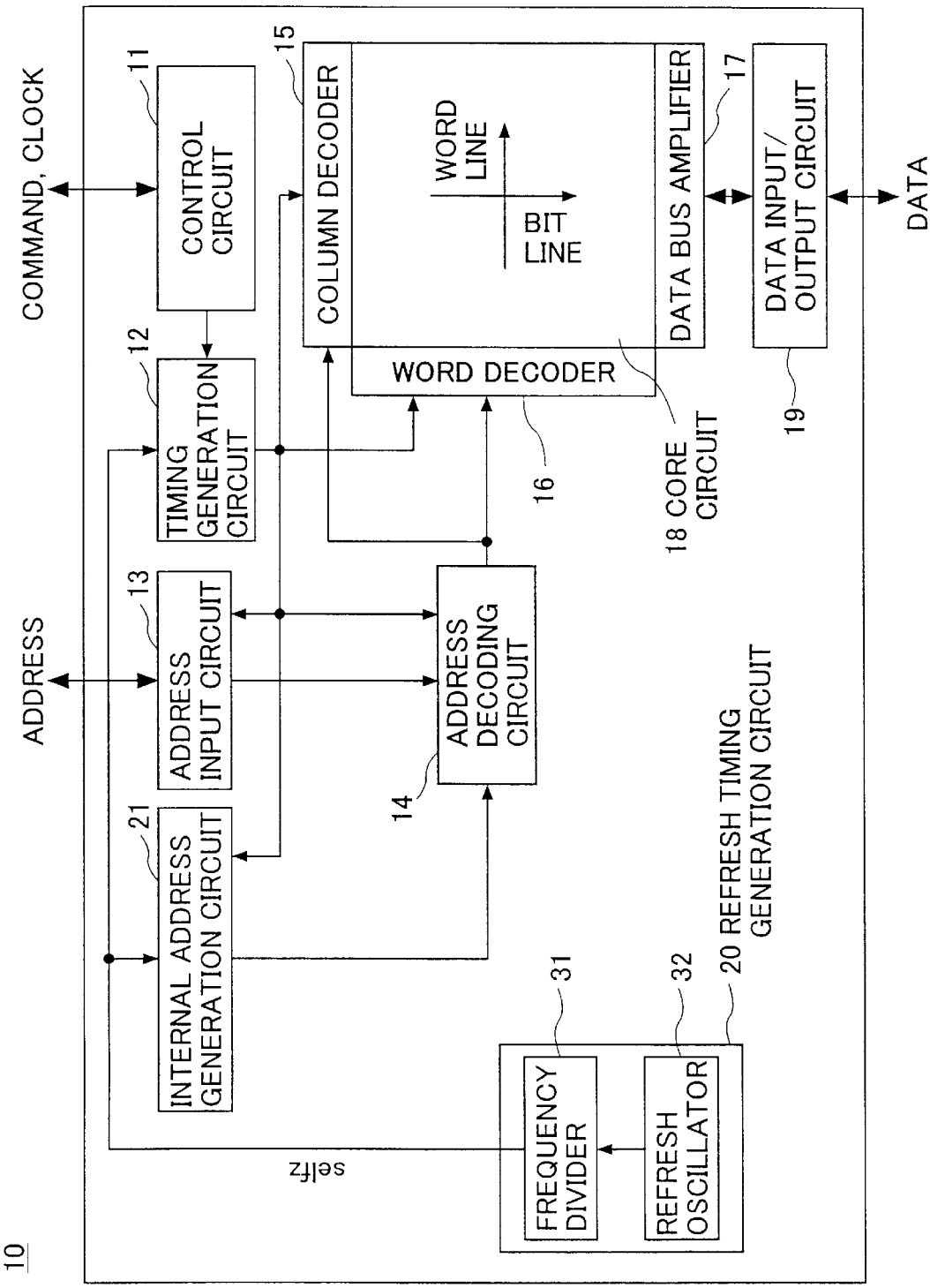
FIG. 3 is a block diagram of a semiconductor memory device to which the present invention is applied.

FIG. 3 is a block diagram of a semiconductor memory device to which the present invention is applied.

The semiconductor memory device 10 of FIG. 3 includes a control circuit 11, a timing generation circuit 12, an address input circuit 13, an address decoding circuit 14, a column decoder 15, a word decoder 16, a data bus amplifier 17, a core circuit 18, a data input/output circuit 19, a refresh timing generation circuit 20, and an internal address generation circuit 21.

The control circuit 11 includes an input circuit for receiving commands and a clock signal from an exterior of the device, and further includes a command decode/control unit for controlling each unit of the semiconductor memory device 10 according the decoding results. The timing generation circuit 12 receives the decoding results and the clock signal from the command decode/control unit of the control circuit 11, and generates internal clock signals and timing pulse signals for controlling various operations. These signals are supplied to various units inside the semiconductor memory device 10.

The address input circuit 13 receives address signals from an exterior of the device, and supplies the address to the address decoding circuit 14 at proper timing. The address decoding circuit 14 decodes the received address, and supplies the decoding results to the word decoder 16 and the column decoder 15.

The word decoder 16 activates a word line indicated by the decoded address, thereby supplying the data of memory cells connected to the activated word line to sense amplifiers via bit lines. These word lines, bit lines, sense amplifiers, and so on are provided in the core circuit 18. The column decoder 15 activates a column selection line of a column indicated by the decoded address, so that the data of sense amplifiers connected to the activated column selection line are supplied to the data bus amplifier 17.

The data bus amplifier 17 supplies the read data to the data input/output circuit 19. The data input/output circuit 19 provides the read data to the exterior of the semiconductor memory device 10, and receives data to be written from the exterior of the device. The data to be written is transferred via the data bus amplifier 17, sense amplifiers, bit lines, etc., to be stored in the memory cells of a selected word.

The refresh timing generation circuit 20 includes a frequency divider 31 and a refresh oscillator 32. The refresh oscillator 32 oscillates to generate periodic pulses. The frequency divider 31 divides the frequency of the generated periodic pulses, thereby generating a refresh pulse signal selfz at constant refresh intervals.

In response to the refresh pulse signal selfz, the internal address generation circuit 21 generates an address at which a refresh operation is to be performed, and supplies this address to the address decoding circuit 14. The refresh pulse signal selfz is also supplied to the timing generation circuit 12. Responsive to the refresh pulse signal selfz, the timing generation circuit 12 generates various timing pulses for executing a refresh operation at proper timing, and provides the generated timing pulses to the address decoding circuit 14, the column decoder 15, the word decoder 16, and the internal address generation circuit 21.

In the present invention, timing control that is different from that of the related art is performed if a refresh operation is executed at an address that uses the same sense amplifiers as a data access operation (active operation). Other operations are basically identical to those of the related-art semiconductor memory devices.

In the following, a refresh operation and a data access operation according to the present invention will be described.

Figure 4:
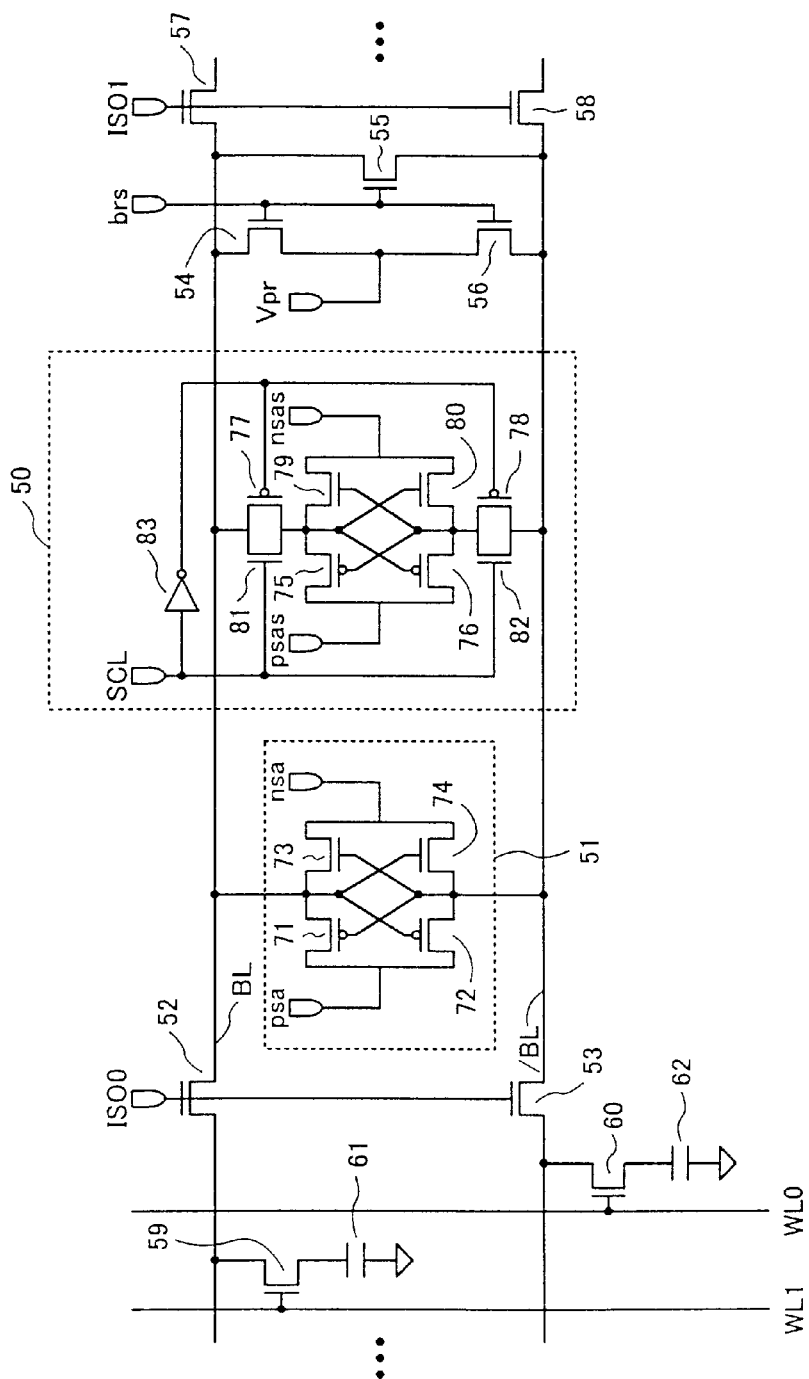
FIG. 4 is a circuit diagram of a main portion around a sense amplifier in a core circuit of the semiconductor memory device according to a first embodiment of the present invention.

FIG. 4 is a circuit diagram of a main portion around a sense amplifier in the core circuit 18 of the semiconductor memory device 10 according to a first embodiment of the present invention.

In FIG. 4, bit lines BL and /BL are connected to memory cells 61 and 62, respectively, through respective NMOS transistors 59 and 60. The NMOS transistors 59 and 60 have the gate thereof connected to word lines WL1 and WL0, respectively.

Further, the bit lines BL and /BL are connected to a sense amplifier 51 and a latch 50. A portion of the bit lines BL and /BL where the sense amplifier 51 and the latch 50 are connected can be freely connected/disconnected by transfer gates to/from the remaining portion of the bit lines where the memory cells are provided. These transfer gates are comprised of NMOS transistors 52 and 53. Additional transfer gates comprised of NMOS transistors 57 and 58 are provided on the right-hand side of the figure, and an additional memory cell array is connected to a portion extending from these transfer gate. The on/off states of the transfer gates are controlled by the transfer gate signals ISO0 and ISO1.

Further, the bit lines BL and /BL are connected to NMOS transistors 54 through 56, which together make up a precharge circuit. As the precharge signal brs becomes HIGH, these NMOS transistors become conductive. As a result, the bit lines BL and /BL are set at a precharge potential Vpr, and are short-circuited to each other to make sure that they are set at the same potential.

The sense amplifier 51 includes PMOS transistors 71 and 72 and NMOS transistors 73 and 74. The latch 50 includes PMOS transistors 75 through 78, NMOS transistors 79 through 82, and an inverter 83. In the latch 50, the PMOS transistors 75 and 76 and the NMOS transistors 79 and 80 together make up a latch circuit. The PMOS transistor 77 and the NMOS transistor 81 constitute a transfer gate, and the PMOS transistor 78 and the NMOS transistor 82 constitute another transfer gate.

Except for the provision of the latch 50, the configuration of FIG. 4 is basically identical to that of the related art. In the present invention, data being subjected to refreshing is temporarily stored in the latch 50, thereby achieving a high-speed access operation while concurrently performing a refresh operation.

Figure 5:
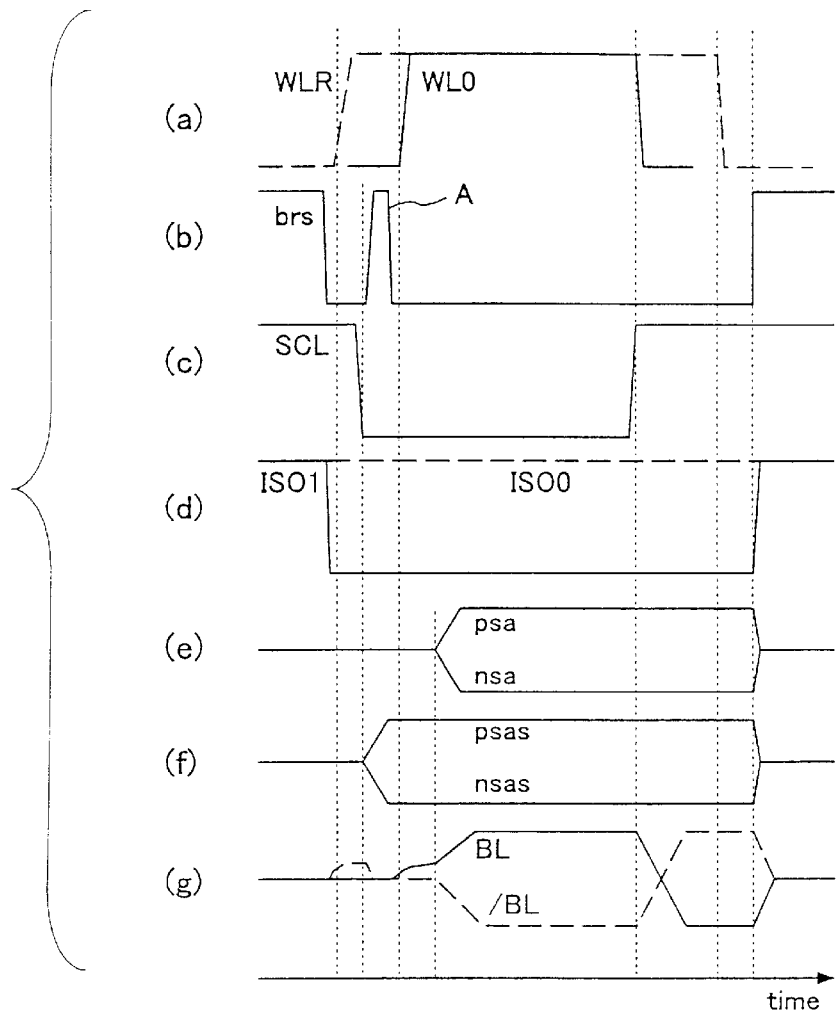
FIG. 5 is a timing chart showing timings of a precharge operation and a data access operation according to the first embodiment of the present invention.

FIG. 5 is a timing chart showing timings of a precharge operation and a data access operation according to the first embodiment of the present invention.

In FIG. 5, a letter designation (a) shows a word-line activation signal WLR for a word to be refreshed and a word-line activation signal WL0 for a word to be accessed. A letter designation (b) shows a precharge signal brs for performing precharge and equalization processing, and a letter designation (c) indicates a latch gate signal SCL that opens or closes the transfer gates for connecting the latch 50 to the bit lines BL and /BL. When the latch gate signal SCL becomes HIGH, the latch 50 is connected to the bit lines BL and /BL. A letter designation (d) shows transfer gate signals ISO0 and ISO1 for connecting the sense amplifier to the cell arrays provided on both sides of the sense amplifier. When the transfer gate signal ISO0 becomes HIGH, the sense amplifier is connected to the cell array provided on one side. When the transfer gate signal ISO1 becomes HIGH, the sense amplifier is connected to the cell array situated on the other side. A letter designation (e) indicates sense amplifier driving signals psa and nsa for driving the sense amplifier 51, and a letter designation (f) illustrates latch driving signals psas and nsas for driving the latch 50. Further, a letter designation (g) demonstrates bit-line potentials BL and /BL.

The word-line activation signal WLR turns HIGH (FIG. 5, (a)), thereby selecting a word to be refreshed. As a result, data of memory cells connected to the word to be refreshed is read to the bit lines BL and /BL (FIG. 5, (g)). When this happens, the latch gate signal SCL is at the HIGH level (FIG. 5, (c)), and the latch 50 is connected to the bit lines BL and /BL. The refresh data on the bit lines BL and /BL is thus transferred to internal nodes of the latch 50. The latch gate signal SCL is thereafter changed to LOW (FIG. 5, (c)) to close the latch transfer gates. As a result, the data of the bit lines BL and /BL is locked inside the latch 50.

The precharge signal brs is activated (shown as a pulse A in FIG. 5, (b)) after the latch gate signal SCL is changed to LOW, thereby resetting (precharging and equalizing) the bit lines BL and /BL (FIG. 5, (g)).

After the operations as described above, access to memory cells subjected to data access is carried out. In the case of a data read operation, for example, the word-line activation signal WL0 for data access is changed to HIGH (FIG. 5, (a)) to select a word to be subjected to data access. In response, the data of memory cells connected to the word to be subjected to data access is read to the bit lines BL and /BL (FIG. 5, (g)). Following the mappearing of data on the bit lines BL and /BL, the sense amplifier driving signals psa and nsa are activated (FIG. 5, (e)), so that the sense amplifier 51 latches the data of the bit lines BL and /BL. As the data of the bit lines BL and /BL is amplified, the restoration of data into the memory cells is accomplished. When this happens, the word line of the memory cells to be refreshed is also maintained at the activated level, so that the data of the accessed word ends up being written into the memory cells being refreshed. In the end, however, the refresh data is restored in these memory cells, as will be described in the following, thereby causing no trouble. After the data being accessed is restored in the corresponding memory cells, the word-line activation signal WL0 of the word being subjected to data access is deactivated (FIG. 5, (a)).

Concurrently with the above operation, the latch driving signals psas and nsas are activated in the latch 50 (FIG. 5, (f)). This causes the refresh data continuing to exist at the nodes of the latch 50 to be amplified and latched.

After the word-line activation signal WL0 is deactivated, the latch gate signal SCL is changed to HIGH (FIG. 5, (c)), thereby connecting the latch 50 to the bit lines BL and /BL. As a result, the refresh data retained in the latch 50 is written into the bit lines BL and /BL. Since the word line of the memory cells being refreshed is maintained at the activated level during this operation (FIG. 5, (a)), the refresh data is written into the memory cells being refreshed. Thereafter, the word-line activation signal WLR of the word being refreshed is deactivated (FIG. 5, (a)).

When the operations described above are completed, resetting is made to the bit lines BL and /BL, the sense amplifier 51, and the latch 50.

Figure 6:
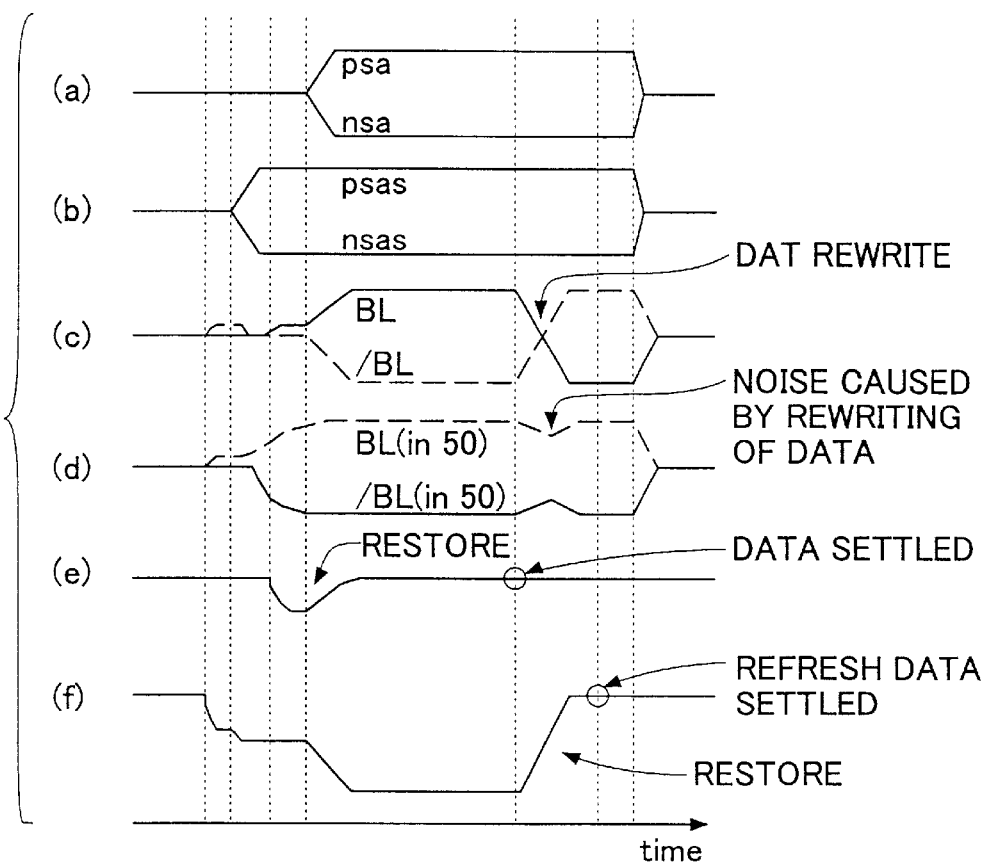
FIG. 6 is a timing chart showing changes in latch node potentials and a memory cell potential.

FIG. 6 is a timing chart showing changes in latch node potentials and a memory cell potential when the operations described above are performed.

In FIG. 6, a letter designation (a) shows sense amplifier driving signals psa and nsa for driving the sense amplifier 51, and a letter designation (b) illustrates latch driving signals psas and nsas for driving the latch 50. Further, a letter designation (c) demonstrates potentials of the bit lines BL and /BL. These signals are the same as those shown in FIG. 5.

Further, a letter designation (d) indicates the potentials of internal nodes of the latch 50, and (e) shows the potential of a memory cell that is subjected to data accessing. Further, a letter designation (f) exhibits the potential of a memory cell that is subjected to refreshing.

As shown in FIG. 6, (d), the internal nodes of the latch 50 have refresh data transferred from the bit lines BL and /BL. When the latch driving signals psas and nsas are activated, the refresh data is amplified and latched. In order to restore the refresh data, the data stored in the latch 50 is written into the bit lines BL and /BL to overwrite the existing data. When this is done, the refresh data of the latch 50 may suffer a noise. This does not pose a problem since the driving power of the latch 50 is sufficiently strong.

As shown in FIG. 6, (e), the data of the memory cell that is subjected to data accessing experience changes in the potential thereof as a result of a data read operation, but is immediately restored thereafter.

As shown in FIG. 6, (f), the memory cell being refreshed has the storage potential thereof affected by the reading of accessed data, and has the accessed data written therein. Since the data stored in the latch 50 is then returned, however, the original data can be restored.

Figure 1:
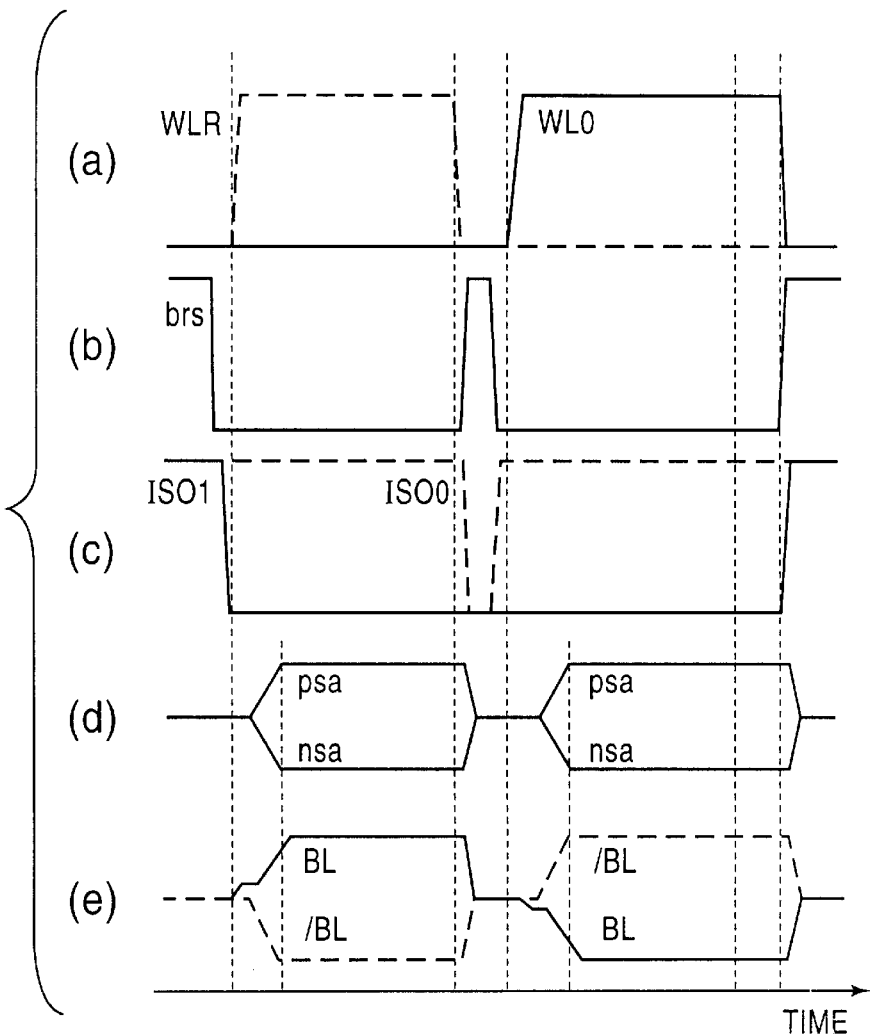
FIG. 1 is a timing chart for explaining a related-art scheme that performs a refresh operation concurrently with a data access operation.
Figure 2:
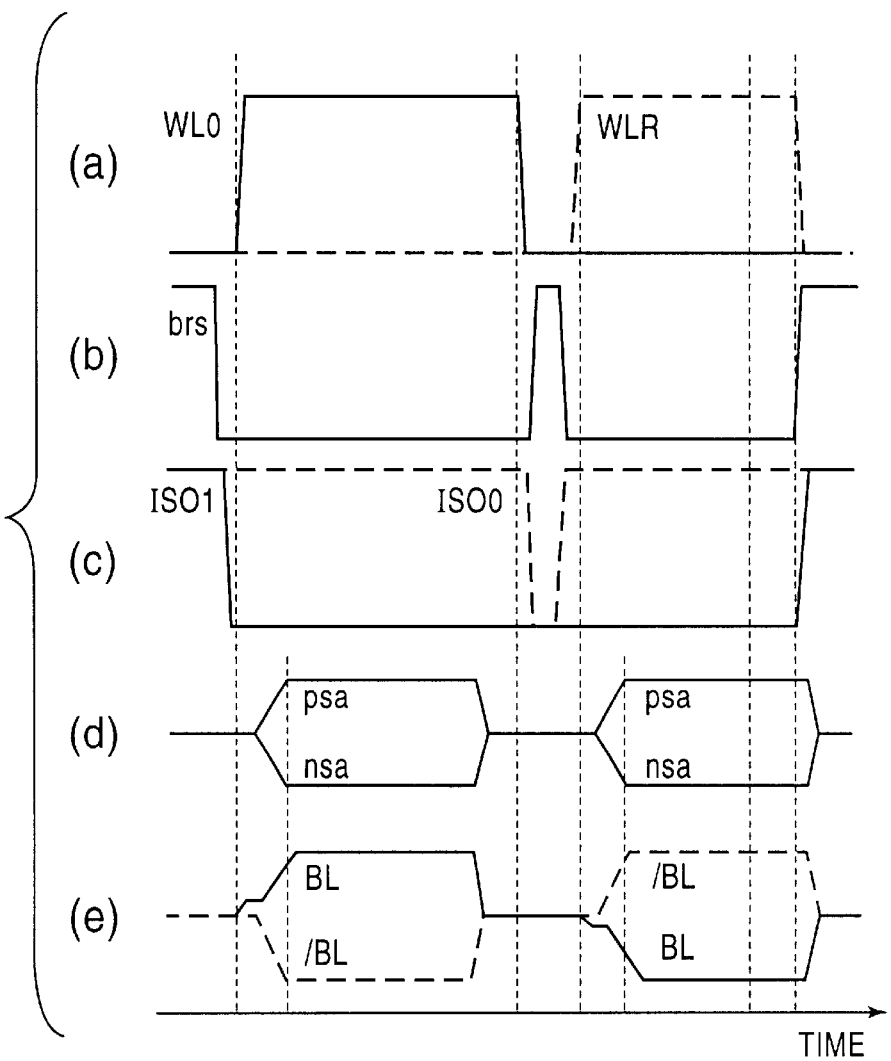
FIG. 2 is another timing chart for explaining the related-art scheme that performs a refresh operation concurrently with a data access operation

As described above, the present invention stores the refresh data temporarily in the latch, and performs a data access operation such as a data read operation or a data write operation, followed by restoring the refresh data of the latch into the refresh memory cell after the completion of the data access operation. This configuration that concurrently performs the refresh operation and the data access operation can make invisible the refresh cycles from outside the device. Since there is no need to perform both a word-line selection and a data-restoration operation twice consecutively as in the related-art configuration shown in FIG. 1 and FIG. 2, the present invention can shorten a delay in the data access time compared to the related-art configuration. Accordingly, the present invention can provide a semiconductor memory device that frees from the refresh cycles and performs high-speed data access operations, thereby providing an interface that is comparable to that of SRAM (static random access memory).

Figure 7:
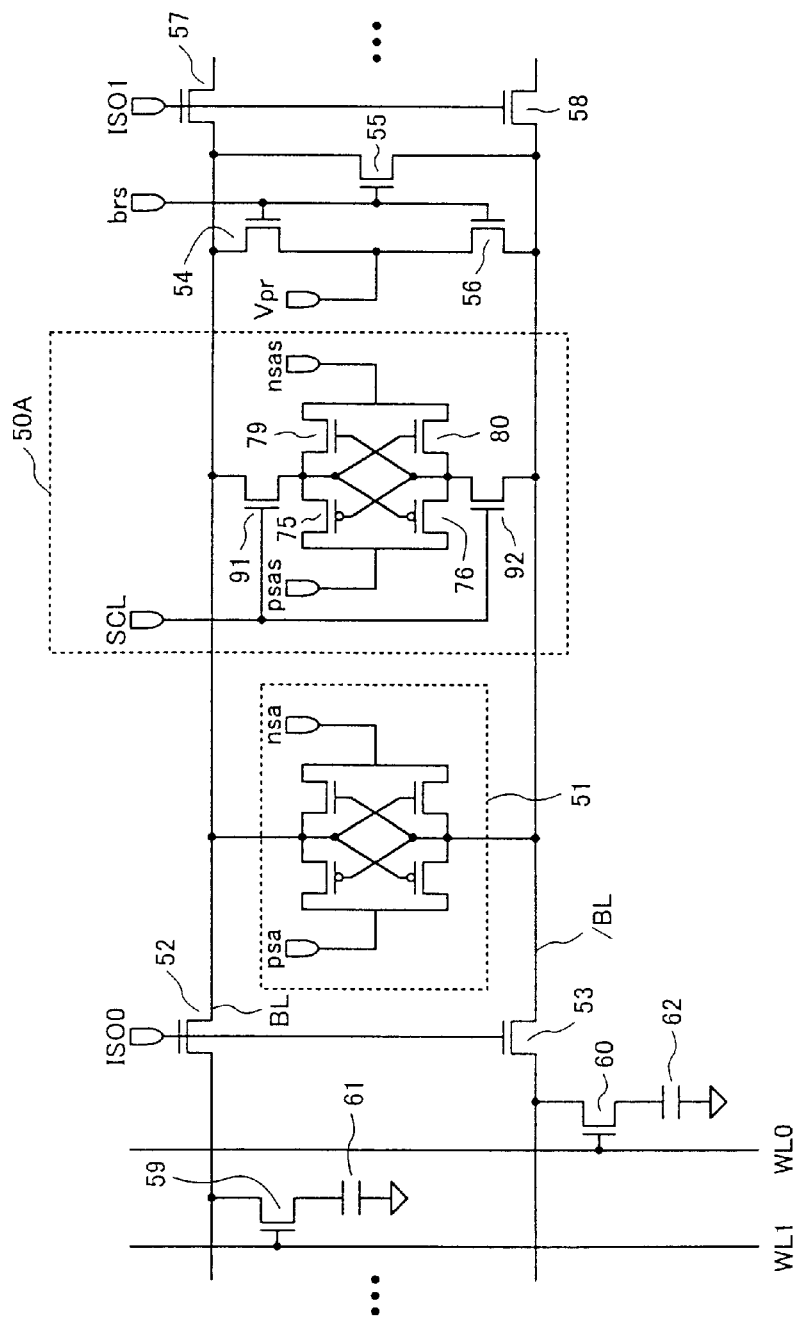
FIG. 7 is a circuit diagram of a main portion around a sense amplifier in the core circuit of the semiconductor memory device according to a second embodiment of the present invention.

FIG. 7 is a circuit diagram of a main portion around a sense amplifier in the core circuit 18 of the semiconductor memory device 10 according to a second embodiment of the present invention.

In the second embodiment shown in FIG. 7, a latch 50A replaces the latch 50 where the latch 50A has the latch transfer gates thereof comprised of NMOS transistors 91 and 92. Other configurations are the same as those of the first embodiment.

In the second embodiment, operation timing is identical to that of the first embodiment, but a circuit structure can be simpler. In order to achieve reliable data transfer, however, it may be necessary to apply a boosted voltage to the gates of the NMOS transistors 91 and 92.

Figure 8:
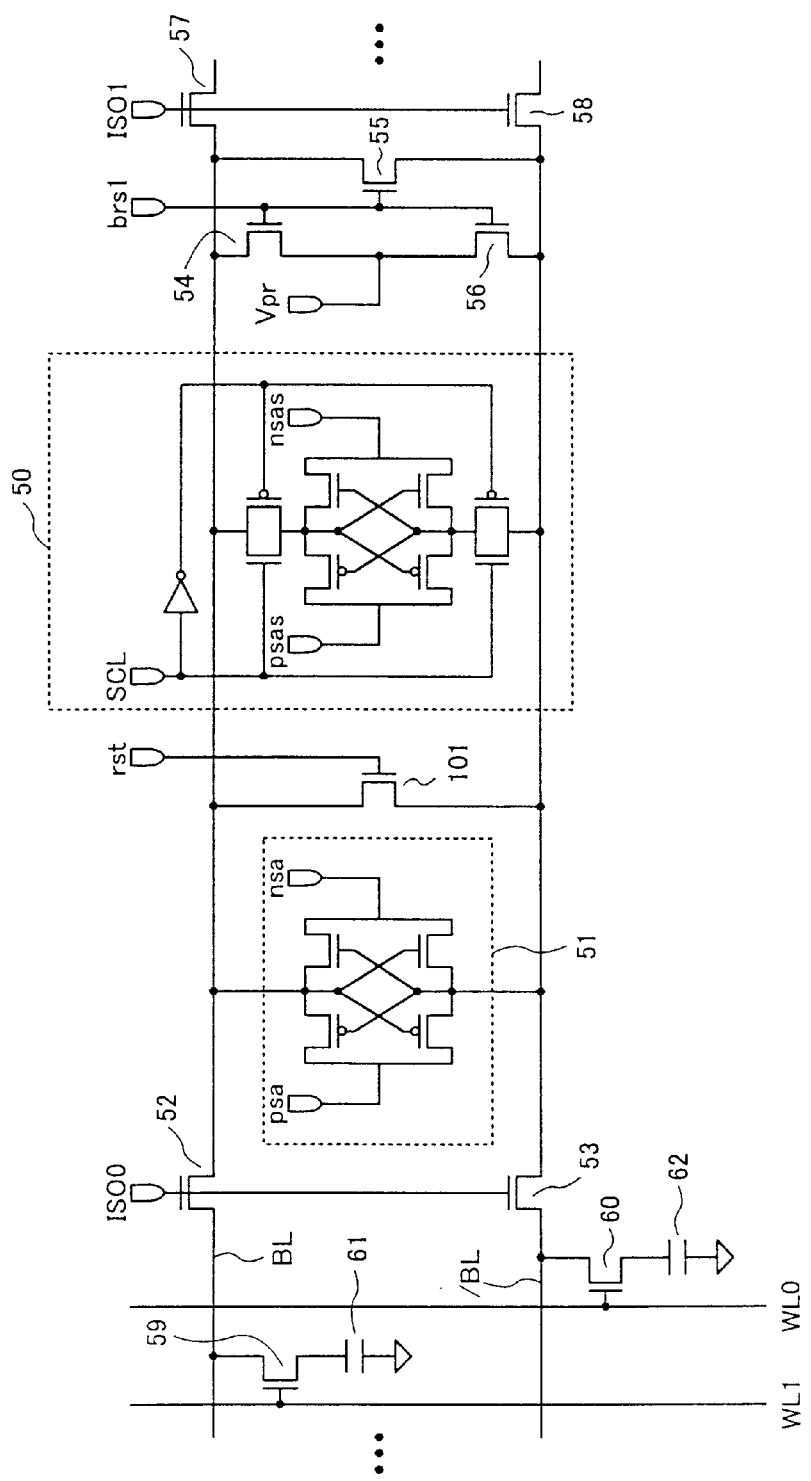
FIG. 8 is a circuit diagram showing a main portion around a sense amplifier in the core circuit of the semiconductor memory device according to a third embodiment of the present invention.

FIG. 8 is a circuit diagram showing a main portion around a sense amplifier in the core circuit 18 of the semiconductor memory device 10 according to a third embodiment of the present invention.

In the third embodiment shown in FIG. 8, a bit-line short-circuit transistor (bit-line resetting circuit) 101 is provided for the purpose of short-circuiting the bit lines BL and /BL to make them have the same potential. The gate of the bit-line short-circuit transistor 101 receives a reset signal rst. The gates of the NMOS transistors 54 through 56 receive a precharge signal brs1.

FIG. 9 is a drawing showing signal waveforms of the reset signal rst and the precharge signal brs1.

As shown in FIG. 9, (b), the reset signal rst is a single pulse signal that corresponds to the pulse A of the precharge signal brs shown in FIG. 9, (a), which is the same as that of the first embodiment shown in FIG. 5, (b). As shown in FIG. 9, (c), the precharge signal brs1 is a signal obtained by removing the pulse A from the precharge signal brs of the first embodiment shown in FIG. 9, (a).

The precharge signal brs1 is a signal dedicated for performing precharge operations before and after the activation of a word line, and the reset signal rst is a signal dedicated for resetting the bit lines BL and /BL at the timing of the pulse signal A after the reading of refresh data.

This configuration makes it unnecessary to switch the precharge signal brs from LOW, HIGH, to LOW through a high-speed signal switching operation. Accordingly, restrictions such as a restriction of operation speed imposed by blunted signal waveforms are not present, thereby providing a basis for high-speed control operations.

The bit-line short-circuit transistor 101 of the third embodiment may be provided in the configuration of the second embodiment shown in FIG. 7 so as to combine the second embodiment with the third embodiment.

Further, the present invention is not limited to these embodiments, but various variations and modifications may be made without departing from the scope of the present invention.

The present application is based on Japanese priority application No. 2000-250185 filed on Aug. 21, 2000, with the Japanese Patent Office, the entire contents of which are hereby incorporated by reference.

What is claimed is:

1. A semiconductor memory device, comprising:

bit lines which transfer data of memory cells;

a sense amplifier which is connected to said bit lines, and amplifies data on said bit lines that appears in response to an external access;

a latch circuit which is connected to said bit lines, and amplifies and latches data on said bit lines that appears as data to be refreshed; and a gate circuit that is situated between said bit lines and said latch circuit, and controls an on/off state of an electrical connection between said bit lines and said latch circuit.

2. The semiconductor memory device as claimed in claim 1, wherein the data amplification by said sense amplifier and the data amplification and latching by said latch circuit are concurrently performed.

3. The semiconductor memory device as claimed in claim 1, wherein said sense amplifier and said latch circuit are started to be driven at different timings.

4. The semiconductor memory device as claimed in claim 1, wherein said gate circuit turns off the electrical connection between said bit lines and said latch circuit during a period when a word line selected by said external access is activated.

5. A semiconductor memory device, comprising:

bit lines which transfer data of memory cells;

a sense amplifier which is connected to said bit lines, and amplifies data on said bit lines that appears in response to an external access;

a latch circuit which is connected to said bit lines, and amplifies and latches data on said bit lines that appears as data to be refreshed;

a refresh timing generation circuit which generates a refresh signal at constant refresh intervals; and an internal address generation circuit which generates a refresh address in response to the refresh signal, wherein data of the refresh address is said data to be refreshed.

6. A semiconductor memory device, comprising:

bit lines which transfer data of memory cells;

a sense amplifier which is connected to said bit lines, and amplifies data on said bit lines that appears in response to an external access; and a latch circuit which is connected to said bit lines, and amplifies and latches data on said bit lines that appears as data to be refreshed; and word lines that connect the memory cells to said bit lines when said word lines are selectively activated, wherein a first one of said word lines activated for said data to be refreshed is activated for a longer duration than a second one of said word lines activated in response to said external access.

7. The semiconductor memory device as claimed in claim 6, further comprising a bit-line resetting circuit that equalizes a pair of said bit lines to an equal potential, wherein said bit-line resetting circuit equalizes the pair of said bit lines after the activation of the first one of said word lines and before the activation of the second one of said word lines.

8. The semiconductor memory device as claimed in claim 7, further comprising a precharge circuit for precharging said bit lines, wherein said precharge circuit operates at different timing than said bit-line resetting circuit operates.

* * * * *